United States Patent
Dang et al.

(10) Patent No.: US 7,327,598 B2
(45) Date of Patent: Feb. 5, 2008

(54) HIGH PERFORMANCE, LOW LEAKAGE SRAM DEVICE AND A METHOD OF PLACING A PORTION OF MEMORY CELLS OF AN SRAM DEVICE IN AN ACTIVE MODE

(75) Inventors: Luan Dang, Richardson, TX (US); Hiep Van Tran, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/985,629

(22) Filed: Nov. 10, 2004

(65) Prior Publication Data

US 2006/0098474 A1     May 11, 2006

(51) Int. Cl.
G11C 11/00 (2006.01)
(52) U.S. Cl. ............ 365/154; 365/185.13; 365/185.18; 365/226; 365/227; 365/228; 365/229
(58) Field of Classification Search ................ 365/154, 365/185.13, 185.18, 230.03, 226, 227, 228, 365/229
See application file for complete search history.

(56) References Cited

U.S. PATENT DOCUMENTS

| | | | | |
|---|---|---|---|---|
| 5,408,144 A | * | 4/1995 | Sakata et al. ................. 326/21 |
| 6,064,620 A | * | 5/2000 | Mobley .................. 365/230.03 |
| 6,297,674 B1 | * | 10/2001 | Kono et al. .................. 327/108 |
| 6,455,336 B1 | * | 9/2002 | Berndlmaier et al. .......... 438/14 |
| 6,515,887 B2 | * | 2/2003 | Fujimoto ...................... 365/63 |
| 6,856,556 B1 | * | 2/2005 | Hajeck ................... 365/189.11 |
| 6,879,505 B2 | * | 4/2005 | Scheuerlein .................. 365/51 |
| 2005/0094474 A1 | * | 5/2005 | Deng et al. .................. 365/229 |
| 2005/0128789 A1 | * | 6/2005 | Houston ..................... 365/154 |
| 2005/0128790 A1 | * | 6/2005 | Houston ..................... 365/154 |
| 2006/0119393 A1 | * | 6/2006 | Hua et al. ................... 326/121 |
| 2006/0232321 A1 | * | 10/2006 | Chuang et al. ............. 327/427 |

* cited by examiner

*Primary Examiner*—Richard T. Elms
*Assistant Examiner*—Eric Wendler
(74) *Attorney, Agent, or Firm*—Stephen A. Shaw; W. James Brady; Frederick J. Telecky, Jr.

(57) ABSTRACT

An SRAM device and a method of placing a portion of memory cells of an SRAM device in an active mode is provided. In one embodiment, the SRAM device includes a hierarchical grouping of memory cells of memory cells and biasing circuitry, coupled to the hierarchical grouping of memory cells, configured to bias a subset of the set based on a memory address associated therewith. In another embodiment, a method includes receiving a memory address associated with the hierarchical grouping of memory cells and biasing a subset of the hierarchical grouping of memory cells based on the memory address.

18 Claims, 3 Drawing Sheets

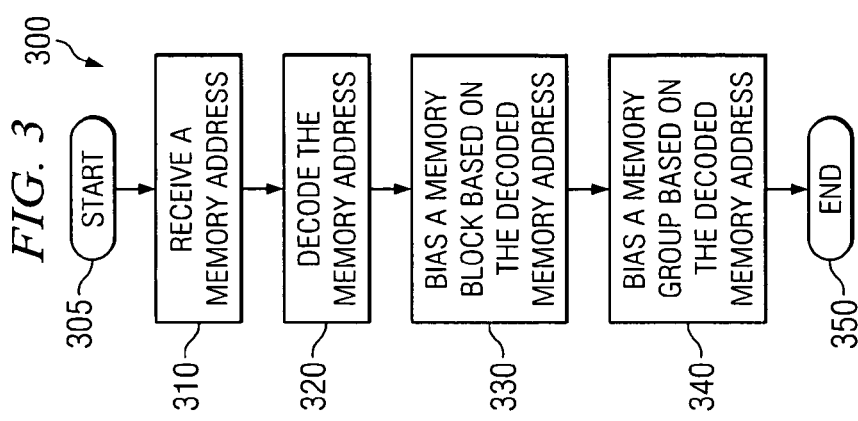
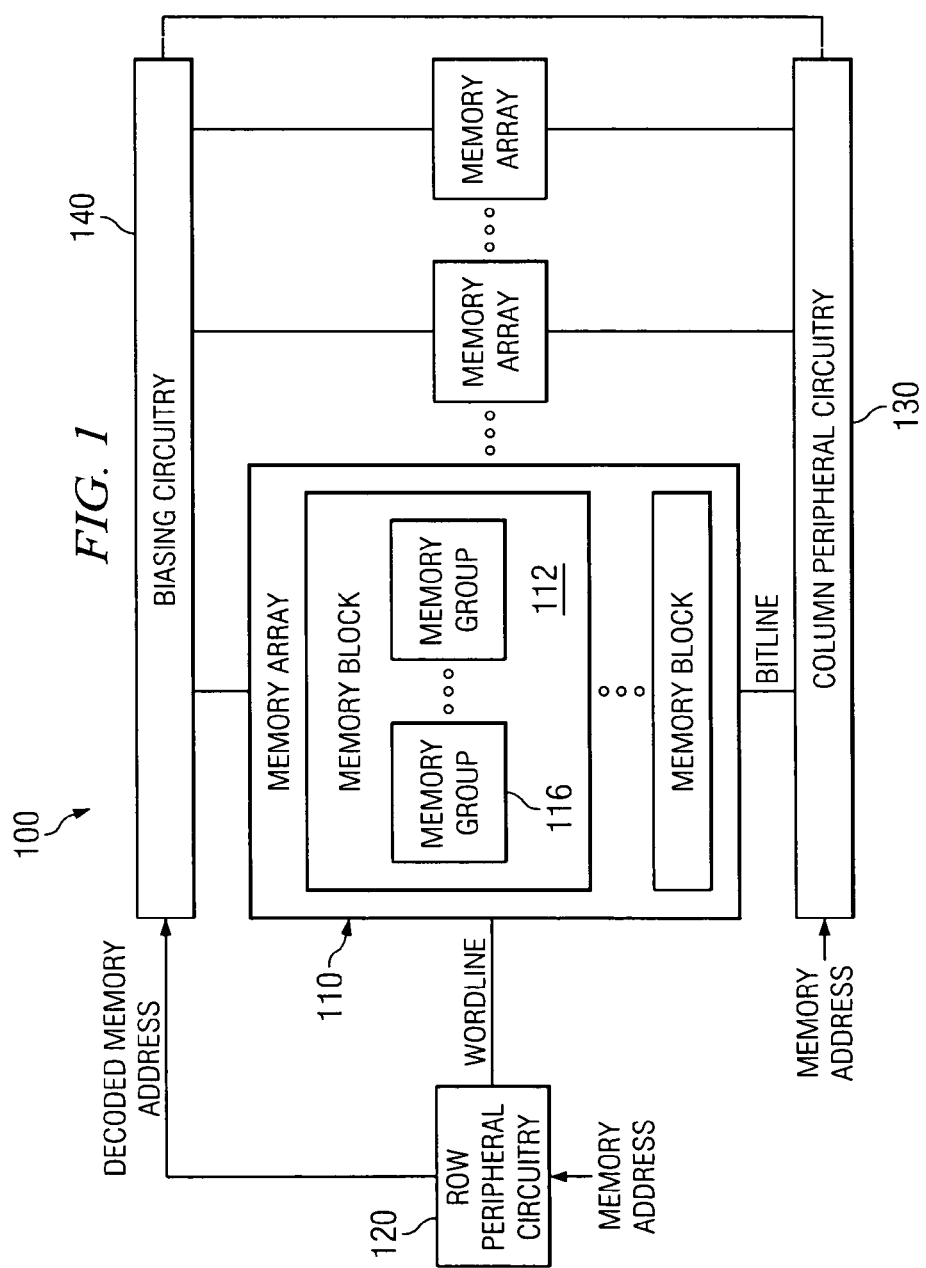

HIGH PERFORMANCE, LOW LEAKAGE SRAM DEVICE AND A METHOD OF PLACING A PORTION OF MEMORY CELLS OF AN SRAM DEVICE IN AN ACTIVE MODE

TECHNICAL FIELD OF THE INVENTION

The present invention is directed, in general, to memory devices and, more specifically, to a Static Random-Access Memory an SRAM device in an active mode.

BACKGROUND OF THE INVENTION

Different types of memory are used in electronic apparatus for various purposes. Read-Only Memory (ROM) and Random Access Memory (RAM) are two such types of memory commonly used within computers for different memory functions. ROM retains its stored data when power is switched off and therefore is often employed to store programs that are needed for initializing (colloquially, "booting up") an apparatus. ROM, however, does not accommodate writing. RAM, on the other hand, allows data to be written to or read from selected addresses associated with memory cells and, therefore, is typically used during normal operation of the apparatus.

Two common types of RAM are dynamic RAM (DRAM) and static RAM (SRAM). DRAM is typically used for the main memory of computers or other electronic apparatuses since, though it must be refreshed, it is typically inexpensive and requires less chip space than SRAM. Though more expensive and space-consumptive, SRAM does not require refreshing thereby making it a faster memory option. In addition, SRAM may use metal-oxide-semiconductor (MOS) technology, allowing it to have a relatively low standby power. These attributes make SRAM devices particularly desirable for portable equipment, such as cellular telephones, laptop computers and personal digital assistants.

A typical SRAM device includes a matrix of addressable memory cells arranged in columns and rows and referred to as an SRAM array. A typical memory cell includes two access transistors and a flip-flop having two memory transistors and two loads. The gates of the access transistors in each row are connected to a wordline and the sources of each access transistor are connected to either one of a bitline pair, B or $\overline{B}$. Peripheral circuitry associated with the rows (or wordlines) and peripheral circuitry associated with the columns (or bitlines) facilitate reading data from, and writing data to, the memory cells.

Generally, to read data from a memory cell, a wordline driver activates a wordline according to an address decoded by a row decoder and received via a row signal path that typically includes an address bus connected to the SRAM device. The access transistors turn on and connect the outputs of the flip-flop to the bitline pair sending signals representing the data in the memory cell to a sense amplifier coupled to the bitline pair that amplifies the potential difference thereon. After the data is stabilized, a column decoder selects the corresponding column, or bitline pair, and outputs a data signal to a data output buffer and then to the external circuitry of the associated electronic apparatus. Essentially, data may be written to each memory cell in an opposite way.

As mentioned above, to retain the data written to the matrix of memory cells, or memory array, each memory cell must have a continuous supply of power. SRAM devices, however, are often employed within battery-powered wireless apparatus where power consumption is an important design parameter. Accordingly, wireless apparatus may be transitioned from an active or idle mode to a standby mode of lower power consumption. As transistor size continues to diminish (e.g., 90 nm transistors), current leakage may be unacceptably high even during standby mode, requiring a transition to a still lower power consumption level, a data retention or sleep mode, to conserve power adequately. The battery-powered wireless apparatus, therefore, may power-down the row and column circuitry associated with the memory array and enter the sleep mode while still supplying sufficient power to the memory array to retain data.

Accessing data of a SRAM device in a standby mode, however, suffers due to time and energy required to transition from the standby mode to an active mode. Thus, even though standby modes reduce power consumption of the SRAM device, performance of the SRAM device is also reduced.

Accordingly, what is needed in the art is an improved high performance, low leakage SRAM device. More specifically, what is needed in the art is an improved SRAM device that minimizes leakage while still maintaining high performance during an active mode.

SUMMARY OF THE INVENTION

To address the above-discussed deficiencies of the prior art, the present invention provides an SRAM device and a method of placing a portion of memory cells of an SRAM device in an active mode. In one embodiment, the SRAM device includes (1) a set of memory cells and (2) biasing circuitry, coupled to the set, configured to bias a subset of the set based on a memory address associated therewith.

The present invention provides a low-leakage active mode SRAM for high performance access with flexible hierarchical grouping of the memory cells. The hierarchical grouping advantageously divides the SRAM device at least into sets and subsets of memory cells to reduce bitline capacitance and, thus, improve access time for the SRAM. The biasing circuitry advantageously employs a decoded memory address signal to selectively bias sets and subsets of memory cells.

The sets and subsets may be memory blocks and memory groups, respectively. Typically, the biasing circuitry includes switches or a switch pair distinctly associated with one of the memory blocks or memory groups and logic circuitry that couples the unique switches to a row decoder to receive the decoded memory address signal. Each of these unique switches allow independent control of the memory blocks and groups. Thus, the present invention introduces the novel concept of selectively biasing the memory blocks and the memory groups by controlling the switches dedicated thereto based upon a memory address associated with the SRAM device. By selectively biasing portions of the hierarchical grouping, an unselected block or blocks can be placed into a lowest possible leakage state while a selected group (an addressed group) can be placed into the high performance, full access stage. The configuration of the memory blocks or groups and the number of associated switches may be based on a cost-benefit analysis of additional switches versus current leakage.

In another aspect, the present invention provides the method of placing a set of memory cells of an SRAM in an active mode including (1) receiving a memory address associated with the set and (2) biasing a subset of the set based on the memory address.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which:

FIG. 1 illustrates a block diagram of an embodiment of an SRAM device constructed according to the principles of the present invention;

FIG. 3 illustrates a flow diagram an embodiment of a method of placing a portion of memory cells of an SRAM device in an active mode carried out according to the principles of the present invention.

DETAILED DESCRIPTION

Figure 2A:
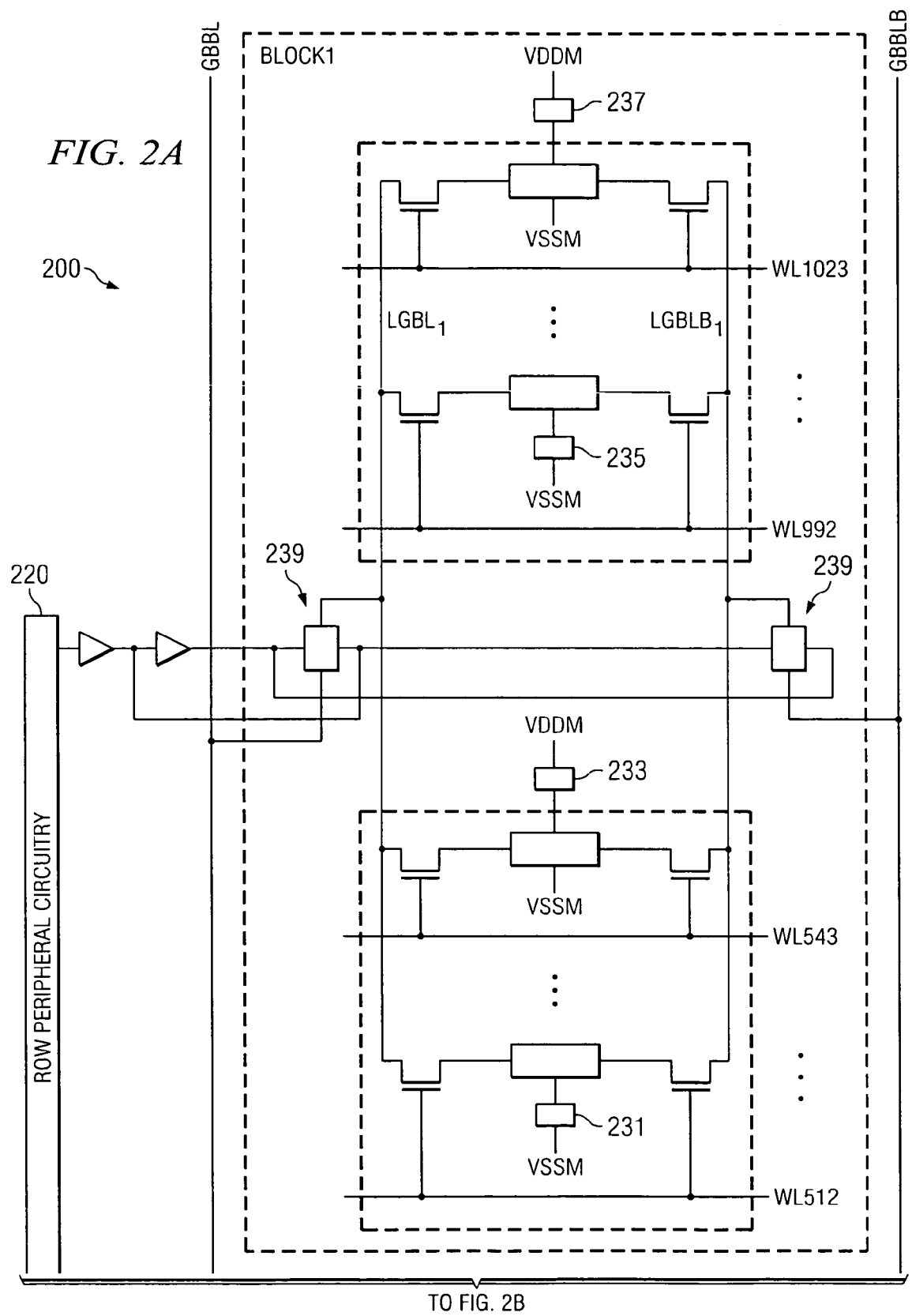
FIG. 2 illustrates a circuit diagram of an embodiment of a portion of an SRAM device constructed according to the principles of the present invention.

Referring initially to FIG. 1, illustrated is a block diagram of an embodiment of an SRAM device, generally designated 100, constructed according to the principles of the present invention. The SRAM device 100 includes a plurality of memory arrays, row peripheral circuitry 120, main column peripheral circuitry 130 and biasing circuitry 140. One memory array of the plurality of memory arrays, memory array 110, is selected to represent each of the plurality of memory arrays.

The memory array 110 includes multiple memory cells organized in a matrix of columns and rows. The memory cells of the memory array 110 are configured into sets denoted as memory blocks and represented by memory block 112. Additionally, the memory cells in memory block 112 are configured into subsets denoted as memory groups and represented by memory group 116. One skilled in the art will understand that the memory array 110, the memory block 112 or the memory group 116 may be considered as a set of memory cells. Additionally, the memory block 112, the memory group 116 or a memory cell may be considered as a subset of memory cells.

The configuration of the memory block 112 and the memory group 116 may vary. For example, the memory block 112 may include more of less memory cells compared to other memory blocks. Likewise for memory groups and memory arrays. Additionally, the number of memory arrays, memory blocks and memory groups of the SRAM device 100 may also vary.

Associated with the memory block 112 is a local bitline (not illustrated). Each memory group within memory block 112, including memory group 116, is coupled to the local bitline. More specifically, each memory cell of the memory block 112 is coupled to the local bitline through the source of an access transistor. The local bitline is unique to the memory block 112 and is coupled to a global bitline of the SRAM device 100 through a switch (i.e., a transmission gate) of the biasing circuitry 140. When the switch is turned on, the local bitline is coupled to the column peripheral circuitry 130 through a selected global bitline.

Since total bitline capacitance in the SRAM device 100 is the sum of all the source of access transistors' capacitance connected to the bitlines and the capacitance of the metal bitlines, hierarchical grouping of the memory array 110 into memory blocks with unique local bitlines reduces bitline capacitance associated with the SRAM device 100. Additionally, hierarchical grouping of the memory array 110 into memory groups allows high performance access due to each of the memory groups being associated with a unique switch or switch pair of the biasing circuitry 140. Operation of the unique switches for the local bitlines and the memory groups will be discussed below regarding the biasing circuitry 140.

Each memory cell of the memory array 110 has a unique address for writing and reading the data. Each memory cell may employ MOSFETs and a flip-flop to store the data as a one (high) or a zero (low). The memory array 110 may have 256 columns and 1024 rows of memory cells. One skilled in the pertinent art, however, will understand that the size of the memory array 110, the memory block 112 and the memory group 116 may vary in different implementations.

The SRAM device 100 may be a memory component for an associated microprocessor, digital signal processor (DSP), application-specific integrated circuit (ASIC) or larger electronic apparatus such as a cellular telephone. In some embodiments, more than one SRAM device 100 may comprise the memory component. Typically, signal paths and a data interface of the associated apparatus may be coupled to the SRAM device 100 to send address information and retrieve/send data for reading/writing the data from/to specific memory cells of the memory array 110. One skilled in the art will understand coupling of the SRAM device 100 to the associated apparatus.

The memory array 110 is coupled to the row peripheral circuitry 120 and the column peripheral circuitry 130 by wordlines and bitlines as represented by the wordline and bitline of FIG. 1. Through the wordlines and the bitlines, reading and writing of the data from/to the memory array 110 may be controlled by the row peripheral circuitry 120 and the column peripheral circuitry 130. The row peripheral circuitry 120 includes components typically included in conventional row peripheral circuitry, such as, row selecting circuitry having a row decoder and a wordline driver. The row peripheral circuitry 120 activates a wordline associated with one of the rows of the memory array 110. The wordline driver may activate the wordline for reading or writing based on an address signal received via a row signal path and decoded by the row decoder. One skilled in the art will understand the configuration and operation of the row selecting circuitry, included in the row peripheral circuitry 120, and the activation of a wordline for reading or writing.

The column peripheral circuitry 130 controls selecting the columns of the memory array 110 for reading and writing. The column peripheral circuitry 130 may include column address decoders for determining memory column locations within the memory array 110 and control circuitry for determining between writing or reading the data.

Additionally, the column peripheral circuitry 130 includes components to facilitate reading and writing data from/to the correct column address that has been decoded. For example, the column peripheral circuitry 130 includes conventional components such as main pre-charge circuitry, main write circuitry, main column MUX and a main sense amplifier. These components may receive control signals along signal paths to indicate what data to write and which memory location to write the data. As with the row peripheral circuitry 120, the column peripheral circuitry 130 may also include additional components that are not illustrated or discussed herein to facilitate writing and reading the data.

The biasing circuitry 140, coupled to the memory array, is configured to bias the memory block 112 and the memory group 116 based on a memory address associated with the memory array 110. The unique switches (not illustrated) of the biasing circuitry 140 associated with the memory block 112 (or more specifically, the local bitline of the memory block 112) and the memory group 116 are operated based on a decode of the memory address. The memory address can be decoded as in conventional SRAM devices. However, unlike conventional SRAM devices, the biasing circuitry 140 employs logic circuitry to advantageously use the decoded memory address to drive the unique switches of the biasing circuitry 140. The logic circuitry is configured to drive an appropriate switch based on the decoded memory address. This reduces bitline capacitance and current leakage by activating local bitlines and placing memory groups in the active mode when selected according to the decoded memory address. The SRAM device 100, therefore, can have unselected memory blocks placed into a lowest leakage stage while selected active memory groups can be placed in a high performance, full access stage. This selective biasing results in leakage reduction while improving access time for selected memory cells.

For example, the decoded memory address signal (i.e., a mux output from the row decoder) may indicate the addressed memory cell is in memory block 112 and be employed to activate the unique switch of the biasing circuitry 140 that couples the local bitline of the memory block 112 to the global bitline. The local bitlines are then connected to the column peripheral circuitry 130 (i.e., the sense amp) when the global bitline is selected according to the decoded memory address from the column decoder.

The decoded memory address may further indicate that the addressed memory cell is in the memory group 116. Accordingly, the decoded memory address signal, via the logic circuitry, may activate a unique local header/footer pair of the biasing circuitry 140 that is associated with the memory group 116 to bias the memory group 116 at an active mode voltage. For example, the decoded memory address signal may activate the unique footer of memory group 116 to bias a low voltage supply of the memory cell matrix, $V_{SSM}$, of memory group 116 at GND. Additionally, the decoded memory address signal may activate the unique header of memory group 116 to bias a high voltage supply of the memory cell matrix, $V_{DDM}$, of memory group 116 at $V_{DD}$. Thus, high performance access of the addressed memory cell is possible.

For purpose of the present invention, a header is a switch, typically a transistor, positioned between a high voltage supply of the SRAM device 100, $V_{DD}$, and selected circuitry. More specifically, a header is limited to circuitry with which it is associated. Thus, for example, a header of the memory group 116 is positioned between circuitry of the memory group 116 and $V_{DD}$. Similarly, a footer is a switch positioned between a low voltage supply of the SRAM device 100, $V_{SS}$, and the selected circuitry. $V_{DD}$ may be at about 1.3 volts.

Wordline leakage in the memory cells may account for approximately 30-35% of total memory cell leakage. Memory cells of unselected memory groups, therefore, are maintained in a lowest possible leakage stage. Thus, maintaining wordlines at a retention voltage $V_{SB}$ is desirable to reduce leakage of unselected memory blocks. $V_{SB}$ is a reference voltage greater than GND (e.g., 0.6 volts) that can be generated, for example, via a voltage drop across a transistor or by a sinking low drop-out (LDO) voltage regulator. For the wordlines associated with the selected memory block 112, the wordlines are set at GND regardless if the wordlines are associated with the selected memory group 116 or not. This avoids reading or writing problems due to switching activity of the selected memory group 116 within the memory block 112.

If a memory block is unselected, the wordline is set to $V_{SB}$. If a memory block is selected, the wordline is set to GND. To provide data integrity, the local bitlines which share the selected and unselected groups in the memory block should be precharged at $V_{DD}$ level. Precharging the local bitlines may be achieved through conventional means well known by one skilled in the art.

For memory groups of unselected memory blocks, the local bitlines float, the wordlines are set at $V_{SB}$ and the sources of the unique footers are set at $V_{SB}$ to provide a lowest possible biasing retention voltage. For unselected groups which share the same local bitline with the selected group (of the same memory block), the sources of the unique footers are biased at the $V_{SB}$ level for low leakage.

Accordingly, the biasing circuitry 140 can bias memory groups based on a biasing condition. The biasing condition is determined based on the memory address. The biasing condition may be based upon an unselected memory group of an unselected memory block, an unselected memory group of a selected memory block and a selected memory group of a selected memory block. Table 1 provides a summary of the above biasing conditions.

TABLE 1

BIAS VOLTAGES OF PORTIONS OF SRAM DEVICE ACCORDING TO MEMORY ADDRESS

| BIASING CONDITION | LOCAL BITLINE | WORD-LINE | MEMORY GROUP FOOTER |
|---|---|---|---|
| UNSELECTED MEMORY GROUP OF AN UNSELECTED MEMORY BLOCK | FLOAT | $V_{SB}$ | $V_{SB}$ |
| UNSELECTED MEMORY GROUP OF A SELECTED MEMORY BLOCK | PRECHARGED AT $V_{DD}$ | GND | $V_{SB}$ |
| SELECTED MEMORY GROUP OF A SELECTED MEMORY BLOCK | PRECHARGED AT $V_{DD}$ | GND | GND |

Figure 2B:
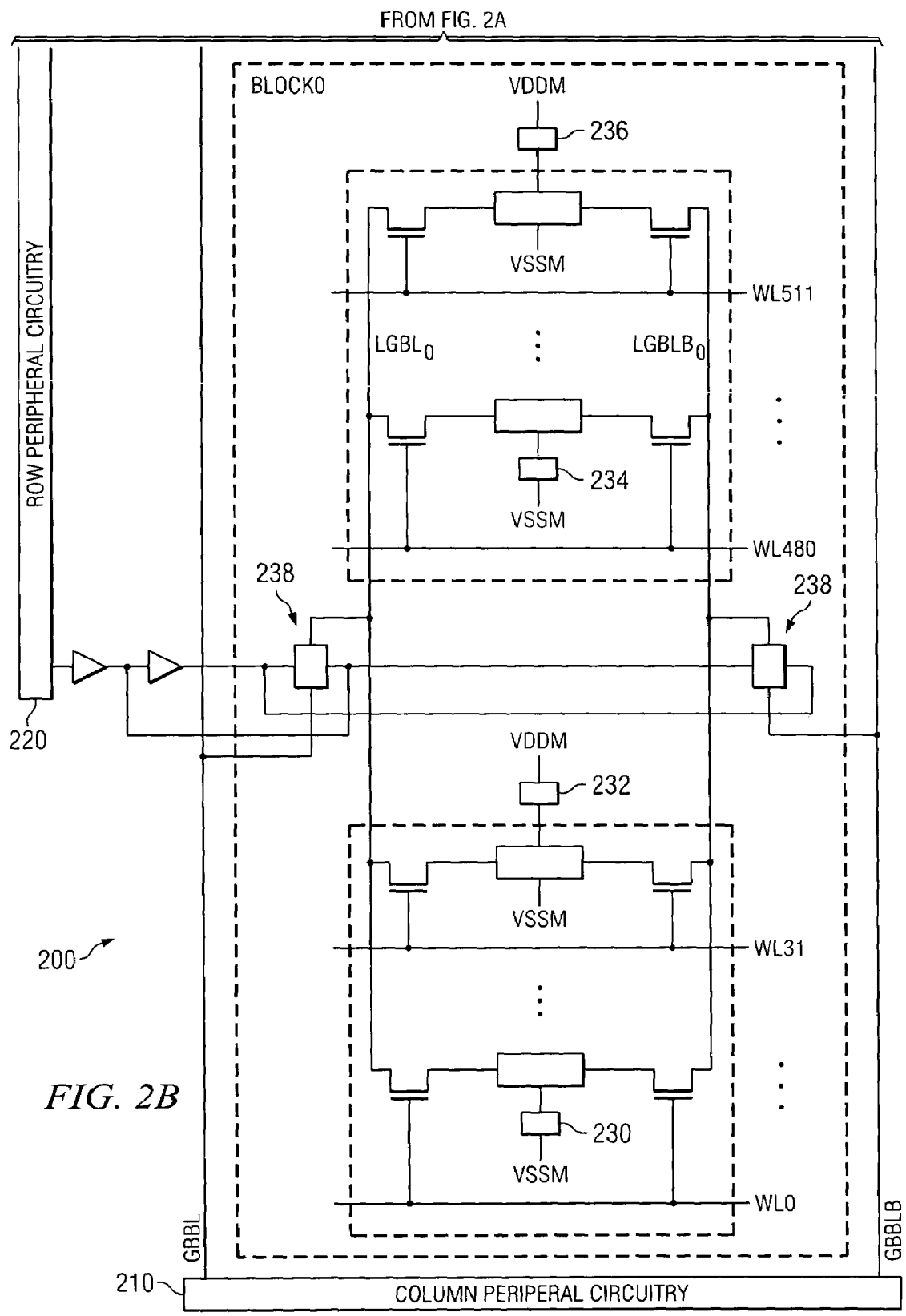

Turning now to FIG. 2, illustrated is a circuit diagram of an embodiment of a portion of an SRAM device, generally designated 200, constructed according to the principles of the present invention. The SRAM device 200 includes a matrix of memory cells, column peripheral circuitry 210, row peripheral circuitry 220 and biasing circuitry. The matrix of memory cells has 1024 rows and 256 columns that are configured into memory block 0 and memory block 1. Each memory block includes 16 memory groups having 32 rows and 256 columns of memory cells. The 16 memory groups in each of memory blocks 0 and 1 are represented in FIG. 2 by two memory groups, a memory group 0 and a memory group 15. Additionally, a single column of memory cells is illustrated to represent each column of the matrix.

Each memory block includes a distinct local bitline, local bitline 0 and local bitline 1, that are designated in FIG. 2 as LCBL1, LCBLB0, and LCBL1, LCBLB1, respectively. Each memory cell within memory block 0 is directly connected to the local bitline 0 and each memory cell of memory block 1 is directly connected to the local bitline 1. An access transistor of each memory cell provides the connection to each respective local bitline.

The local bitlines 0 and 1 are coupled to a global bitline through switches 238, 239, respectively, of the biasing circuitry. The global bitline, designated in FIG. 2 as GBBL GBBLB, couples the local bitlines 0 and 1 to the column peripheral circuitry 210 when the respective biasing circuitry switches, 238 or 239, are activated. The row peripheral circuitry 220 is coupled to each of the memory cells by wordlines. Both the column peripheral circuitry 210 and the row peripheral circuitry 220 include components of column and row peripheral circuitry of a common SRAM device.

In addition to providing a coupling for the local bitlines 0 and 1 to the global bitline, the biasing circuitry also provides a unique switch pair for each memory group. A header and footer for memory groups 0 and 15 of each memory block are illustrated in FIG. 2 to represent the unique switch pairs for each memory group. The source of each unique header 232, 236, 233, 237, is coupled to $V_{DDM}$. The source of each unique footer 230, 234, 231, 235, is coupled to $V_{SSM}$. Additionally, the gate of each unique header and footer is coupled through logic circuitry of the biasing circuitry (not illustrated to avoid confusion) to an output of a row decoder of the row peripheral circuitry 220 to receive an associated portion of a decoded memory address signal. Accordingly, each unique switch of the biasing circuitry is configured to operate based on the decoded memory address signal provided by the row peripheral circuitry 220. Thus, the biasing circuitry is configured to bias the memory blocks and the memory groups based on the decoded memory address.

In one embodiment, the selected memory block is determined by the most significant bit of the decoded row address. For example, considering a 10 bit row address of Ain[0] to Ain[9], since there are only two memory blocks, memory block 0 and memory block 1, a single bit of the memory address is needed to select a memory block. If Ain[9] is one, memory block 1 is selected. Thus, switches 239 of the biasing circuitry, are activated. (through the logic circuitry) to connect the source of each of the access transistors of the memory cells in memory block 1 to local bitline 1.

The next four significant bits of the memory address (since there are 16 memory groups within memory block 1), Ain[5] to Ain[8], are used to determine which memory group of memory block 1 is selected. If Ain[5] to Ain[8] is 0000, then memory group 0 of memory block 1 is the selected (addressed) memory group. Accordingly, switches 231 and 233 of the biasing circuitry are activated (via the logic circuitry) to place the memory group 0 in the active mode. Thus, the switch 233 connects $V_{DDM}$ to $V_{DD}$ and the switch 231 connects $V_{SSM}$ to GND. Additionally, the local bitline 1 is precharged at a $V_{DD}$ level and the wordlines associated with memory block 1 are set to GND.

The remaining bits of the row address, Ain[0] to Ain[4], are used to identify which wordline of memory group 0 in memory block 1 is addressed. The decoded memory address signal from these bits are used to operate the appropriate (addressed) wordline driver. When the addressed column is determined from the column memory address, the appropriate global bitline (GBBL, GBBLB in this example) is selected and couples the local bitline 1 to the column peripheral circuitry 210.

Looking now at memory group 15 of memory block 1, switch 235 is not activated such that $V_{SSM}$ for memory group 15 remains at $V_{SB}$. $V_{SB}$ may be achieved by a voltage drop across the switch 235. In some embodiments a sinking LDO voltage regulator may be employed instead of a transistor to achieve $V_{SB}$. Each wordline associated with memory group 15 is also set GND. One skilled in the art will understand that memory group 15 represents the un-illustrated memory groups 1-14.

Considering memory block 0, since memory block 1 has been selected, neither the switches 230 and 234 nor 232 and 236 are operated to place any of the included memory cells in the active mode. Instead, $V_{SSM}$ for each memory group of memory block 0 remains at $V_{SB}$, the wordlines are biased at $V_{SB}$ and the local bitline 0 is allowed to float.

Turning now to FIG. 3, illustrated is an embodiment of a flow diagram of a method of placing a portion of memory cells of an SRAM device in an active mode, generally designated 300, carried out according to the principals of the present invention. The method begins in a step 305, wherein it is desired to enter an active mode.

After beginning, a memory address associated with a set of the memory cells is received in a step 310. The memory address can be received from an address buffer via a signal path coupling the SRAM device to an associated microprocessor. The size of the memory address may vary according to the number of the memory cells. Typically, the number of bits required for the memory address is the power of two required for the number of rows of memory cells. For example, a matrix of memory cells having 32 rows (32 wordlines) requires a memory address of five bits (two to the power of five equals 32).

After receiving, the memory address is decoded in a step 320. The memory address can be decoded employing a standard address decoder that is typically employed with an SRAM device. Typically, the memory address is divided into a row and column address. The row address is decoded by a row decoder and the column address is decoded by a column decoder.

After decoding the memory address, a memory block is biased in a step 330. The memory block to bias, the selected memory block, is determined by the decoded memory address. The decoded memory address is employed to control a switch that couples the local bitline of the selected memory block to the global bitline. The memory cells of the selected memory block are coupled to the sense amp of the column peripheral circuitry when global bitlines are selected based on the decoded column memory address.

After biasing the memory block, a memory group of the memory block is biased in a step 340. The memory group to bias, the selected memory group, is determined by the decoded memory address. The decoded memory address is employed to control a unique switch pair of the selected memory group. Operation of the unique switch pair allows the selected memory group to be biased in an active mode. After biasing the memory group, the method of placing a portion of memory cells of an SRAM device in an active mode ends in a step 350.

While the methods disclosed herein have been described and shown with reference to particular steps performed in a particular order, it will be understood that these steps may be combined, subdivided or reordered to form an equivalent method without departing from the teachings of the present invention. Accordingly, unless specifically indicated herein, the order and grouping of the steps are not limitations of the present invention.

Although the present invention has been described in detail, those skilled in the art should understand that they can make various changes, substitutions and alterations herein without departing from the spirit and scope of the invention in its broadest form.

What is claimed is:

1. An SRAM device, comprising:
a hierarchical grouping of memory cells; and
biasing circuitry, coupled to said hierarchical grouping of memory cells, having a switch configured to bias a subset of said hierarchical grouping of memory cells by coupling a local bitline of said subset to a global bitline of said hierarchical grouping of memory cells based on a memory address associated therewith, and having a unique footer for at least one subset of said subset configured to bias said at least one subset in an active mode by coupling said at least one subset to ground based on said memory address.

2. The SRAM device as recited in claim 1 further comprising a plurality of memory cell hierarchies and said hierarchical grouping of memory cells is one of said plurality.

3. The SRAM device as recited in claim 1 further comprising multiple subsets of said subset of said hierarchical grouping of memory cells.

4. The SRAM device as recited in claim 1 wherein said subset of said hierarchical grouping of memory cells is one of a plurality of subsets and said biasing circuitry is configured to bias only said subset of said hierarchical grouping of memory cells in an active mode.

5. The SRAM device as recited in claim 1 wherein said switch is configured to operate based on a decoded portion of said memory address.

6. The SRAM device as recited in claim 1 wherein said biasing circuitry employs a decode signal of said memory address.

7. The SRAM device as recited in claim 1 wherein said biasing circuitry biases said subset of said hierarchical grouping of memory cells based on a biasing condition.

8. The SRAM device as recited in claim 1 wherein said biasing circuitry biases said subset of said hierarchical grouping of memory cells into a biasing condition selected from the group consisting of:
an unselected group of an unselected block,
an unselected group of a selected block, and
a selected group of a selected block.

9. The SRAM device as recited in claim 1 wherein said biasing circuitry employs a low drop-out (LDO) voltage regulator.

10. A method of placing a portion of memory cells of an SRAM device in an active mode, comprising:
receiving a memory address associated with a hierarchical grouping of memory cells; and
biasing a subset of said hierarchical grouping of memory cells by controlling a switch based on said memory address to couple a local bitline of said subset to a global bitline of said hierarchical grouping of memory cells and by controlling a unique footer of at least one subset of said subset to couple said at least one subset to ground based on said memory address.

11. The method as recited in claim 10 wherein said hierarchical grouping of memory cells is one of a plurality of memory cell hierarchies.

12. The method as recited in claim 10 wherein said subset of said hierarchical grouping of memory cells includes multiple subsets.

13. The method as recited in claim 10 wherein said subset is one of a plurality of subsets, further comprising biasing only said subset in an active mode.

14. The method as recited in claim 10 wherein said biasing further includes operating a unique header of said at least one subset.

15. The method as recited in claim 10 wherein said biasing includes employing a decode signal of said memory address.

16. The method as recited in claim 10 wherein said biasing includes biasing said subset based on a biasing condition.

17. The method as recited in claim 10 wherein said biasing includes biasing said subset into a biasing condition selected from the group consisting of:
an unselected group of an unselected block,
an unselected group of a selected block, and
a selected group of a selected block.

18. The method as recited in claim 10 wherein said biasing employs a low drop-out (LDO) voltage regulator.

* * * * *